United States Patent [19]

Takeuchi et al.

[11] Patent Number: 4,764,492

[45] Date of Patent: Aug. 16, 1988

[54] LEAD CALCIUM TITANATE PIEZOELECTRIC CERAMIC ELEMENT

[75] Inventors: Kiyoshi Takeuchi; Dragan Damjanovic; Sei-Joo Jang, all of State College, Pa.

[73] Assignee: North American Philips Corporation, New York, N.Y.

[21] Appl. No.: 872,776

[22] Filed: Jun. 10, 1986

[51] Int. Cl.⁴ .............................................. C04B 35/46
[52] U.S. Cl. ................... 501/136; 501/134; 501/135; 252/62.9
[58] Field of Search .................. 501/134, 135, 136; 252/62.9

[56] References Cited

U.S. PATENT DOCUMENTS 3,472,778  10/1969  Tsubouchi et al. ............... 252/62.9
4,319,485  3/1982   Terada et al. .................. 501/134 X
4,321,155  3/1982   Yamashita et al. ............... 252/62.9

FOREIGN PATENT DOCUMENTS 46-23543   7/1971  Japan ................... 252/62.9
56-1409    1/1981  Japan ................... 501/134
60-180951  9/1985  Japan ................... 501/134

Primary Examiner—Mark L. Bell
Assistant Examiner—Ann M. Knab
Attorney, Agent, or Firm—Norman N. Spain

[57] ABSTRACT

An improved lead calcium titanate piezoelectric sintered body is produced by sintering in air at 1000° C.–1200° C. a calcined mixture of oxides or oxide compounds in amounts adapted to form a composition of the formula $Pb_{1-x}Ca_xTi_{1-y}(Co_{\frac{1}{2}}W_{\frac{1}{2}})_yO_3 + 0.005 - 0.02(A)$ where A is at least one of $MnO$, $MnO_2$, $NiO$ and $Nb_2O_3$, wherein $x = 0.3–0.4$ and $0.04 < y \leq 0.06$.

5 Claims, 4 Drawing Sheets

Fig. 1  Coupling, dielectric, piezoelectric constants and dissipation factors as a function of Ca amount X in $Pb_{1-x}Ca_xTi_{1-y}(Co_{1/2}W_{1/2})_yO_3$ + 0.01 MnO (Y=0.04) system

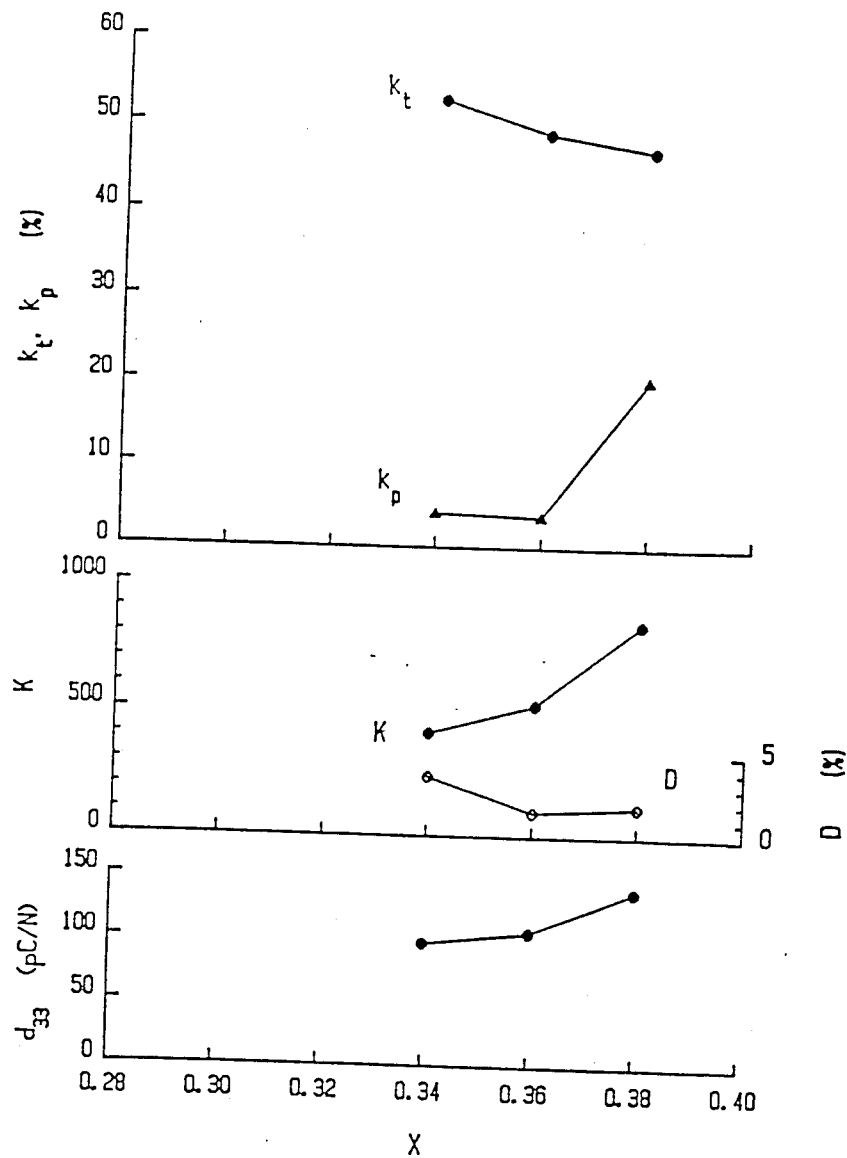
Fig. 1 Coupling, dielectric, piezoelectric constants and dissipation factors as a function of Ca amount X in $Pb_{1-X}Ca_XTi_{1-Y}(Co_{1/2}W_{1/2})_YO_3 + 0.01\ MnO\ (Y=0.04)$ system

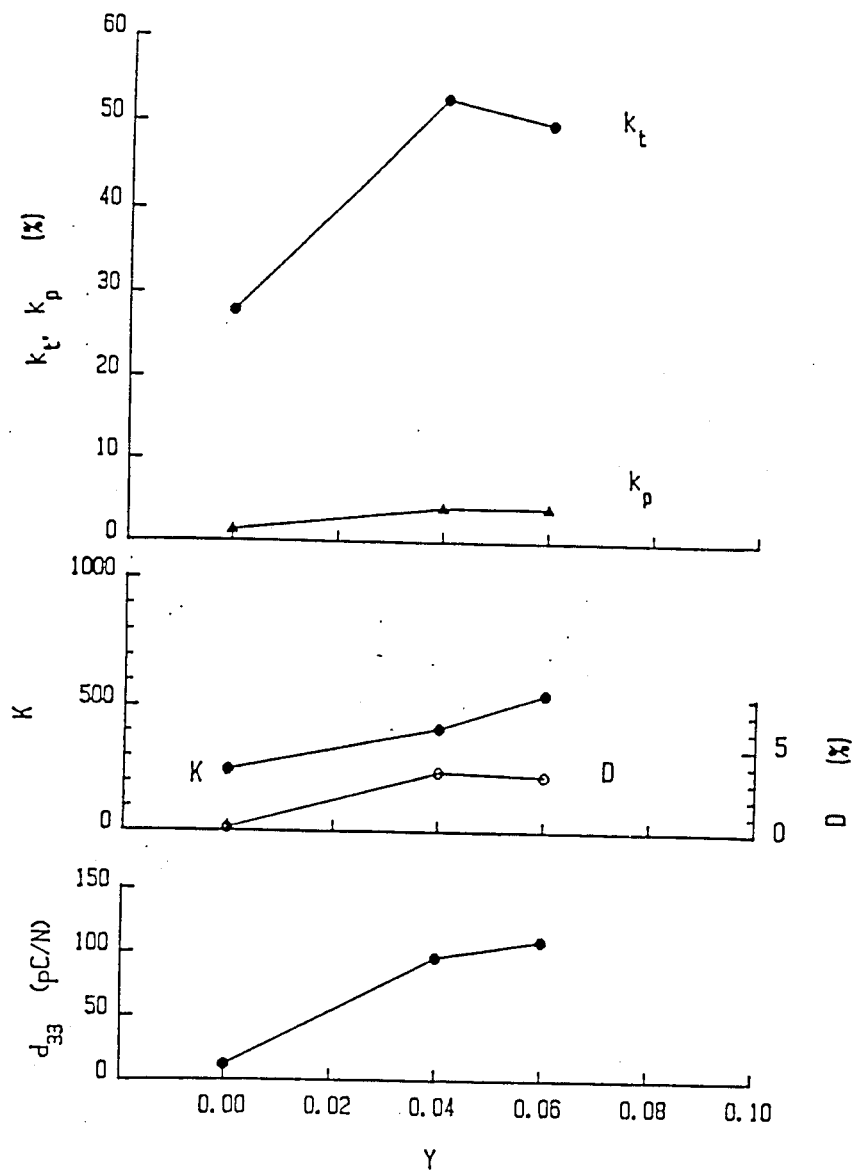
Fig. 2 Coupling, dielectric, piezoelectric constants and dissipation factors as a function of $(Co_{1/2}W_{1/2})$ amount Y in $Pb_{1-X}Ca_XTi_{1-Y}(Co_{1/2}W_{1/2})_YO_3 + 0.01$ MnO (X=0.34) system

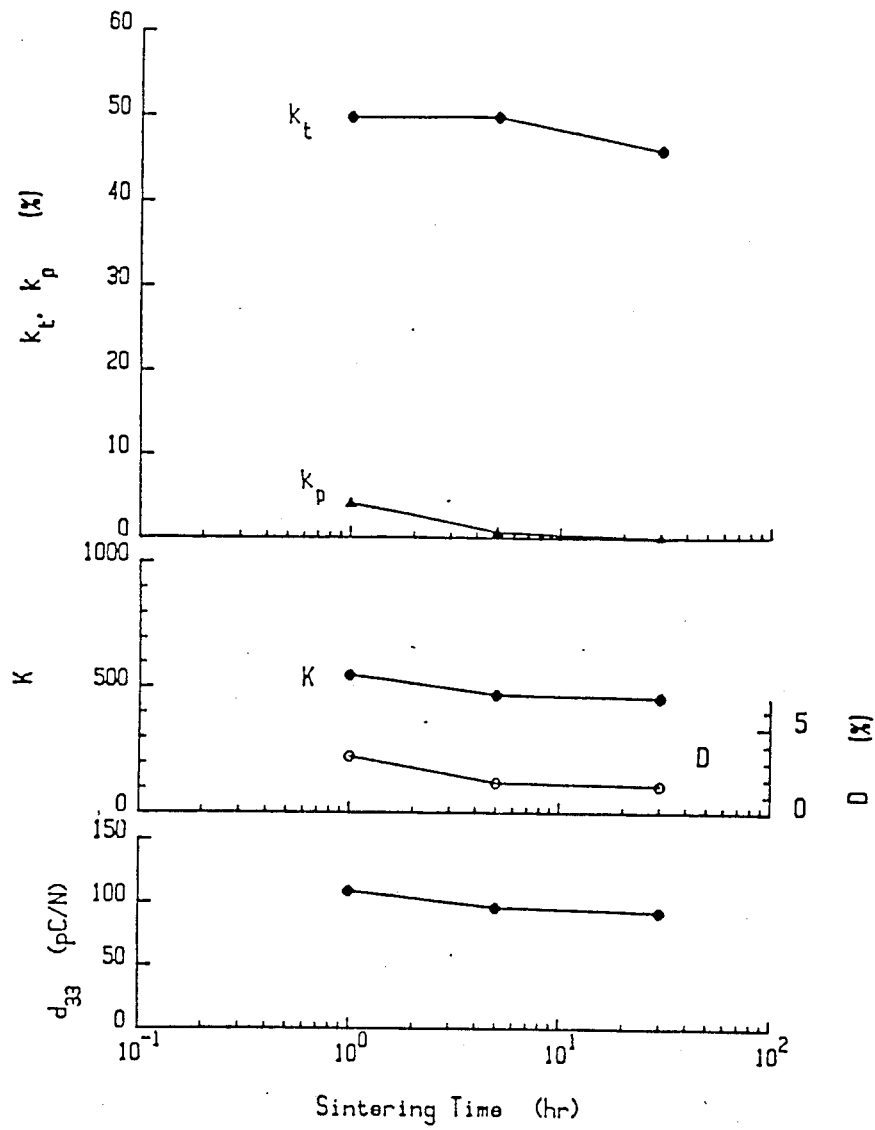
Fig. 3, Coupling, dielectric, piezoelectric constants and dissipation factors as a function of sintering time at the same sintering temperature (1100 °C) in $Pb_{1-X}Ca_X$-$Ti_{1-Y}(Co_{1/2}W_{1/2})_YO_3$ + 0.01 MnO (X=0.34, Y=0.06) system

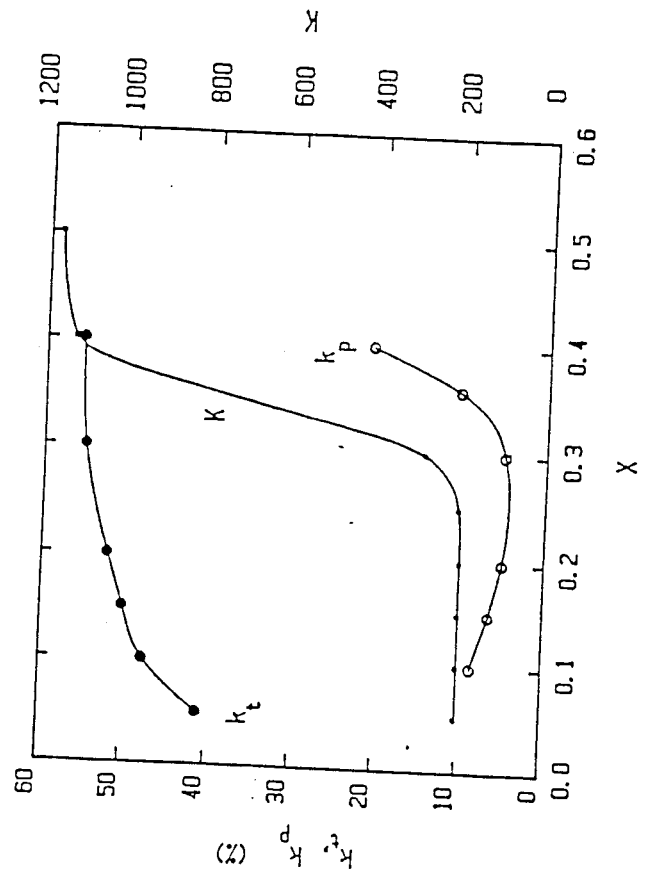
Fig. 4 Electromechanical coupling factors and dielectric constant as a function of Ca amount in $Pb_{1-X}Ca_XTi_{1-Y}(Co_{1/2}W_{1/2})_YO_3 + 0.3$ wt.% MnO + 0.4 wt.% NiO (Y=0.04) system (Yamashita and Yokoyama et al. 1981)

LEAD CALCIUM TITANATE PIEZOELECTRIC CERAMIC ELEMENT

BACKGROUND OF THE INVENTION

This invention relates to new and improved piezoelectric sintered bodies of the lead calcium titanate type.

Articles by Y. Yamashita, K. Tokoyama et al, Japan. J. Appl. Phys. 20, Suppl. 20-4, 183 (1981), Y. Yamashita, S. Yoshida et al, Proc. FMA 4, Kyoto, Japan, 25 (1983) and S. Jyomura et al, J. Appl. Phys. 52, 4472 (1981) disclose sintered lead titanate piezoelectric ceramics exhibit characteristics making these useful for ceramic ultrasonic transducers. However, the piezoelectric ceramics disclosed in these references while showing properties that render these materials useful in some aspects exhibit other properties that make these materials less useful for use in ultrasonic transducers and for similar uses.

While the Yamashita et al 1981 article shows piezoelectric compositions exhibiting a relatively high thickness mode coupling ($k_t$) to planar mode coupling ($k_p$) ratio, it has been found that the piezoelectric constant ($d_{33}$) is not sufficiently high for some purposes.

It is highly desirable for many purposes that the piezoelectric constant $d_{33}$ be increased as far as possible while the ratio of $k_t/k_p$ be maintained as high as possible. Additionally, it is also desired that the dielectric constant K be maintained as high as possible while the dissipation factor D be maintained as low as possible.

SUMMARY OF THE INVENTION

It is an object of this invention to provide a sintered lead titanate body which exhibits a high $k_t/k_p$ ratio a high piezoelectric constant ($d_{33}$), a high dielectric constant (K) and a low dissipation factor (D).

According to one aspect of the invention, it has been found that a novel sintered lead calcium titanate of the formula $Pb_{1-x}Ca_xTi_{1-y}(Co_{\frac{1}{3}}W_{\frac{2}{3}})_yO_3 + 0.005 - 0.02(A)$ where A is at least one of $MnO$, $MnO_2$, $NiO$ or $Nb_2O_3$ and wherein $x=0.3-0.4$ and $0.04 < y \leq 0.06$ exhibit an improved combination of a high piezoelectric constant $d_{33}$, a high $k_t/k_p$ coupling ratio, a low dissipation factor D and a high dielectric constant K.

According to another aspect of the invention, a new and novel method has been developed for producing the novel piezoelectric bodies of the invention.

In this method of the invention the novel piezoelectric bodies are produced by calcining a mixture of PbO, CaO, TiO, CO(OH)$_2$, WO$_3$ and at least one of MnO, MnO$_2$, NiO or Nb$_2$O$_3$ the precursors of these materials and then sintering the resultant calcined mixture in an atmosphere consisting essentially of 10 to 20% of oxygen and 90-80% of nitrogen at a temperature of 1000° C.-1200° C. for a period of approximately 1-50 hours.

BRIEF DESCRIPTION OF THE DRAWING

In the drawing,

FIG. 1 is a graph showing the thickness coupling factor, the planar coupling factor, the dielectric constant, the piezoelectric constant and the dissipation factor as a function of the amounts of calcium present in the piezoelectric bodies;

FIG. 2 is a graph showing the thickness coupling factor, the planar coupling factor, the piezoelectric constant, the dielectric constant, and the dissipation factor as a function of the amount of cobalt and tungsten present in a piezoelectric body of the invention;

FIG. 3 shows the thickness coupling factor, the planar coupling factor, the dielectric constant, the piezoelectric constant and the dissipation factor as a function of the sintering time in producing the piezoelectric bodies of the invention; and FIG. 4 is a graph showing the thickness coupling constant, the planar coupling constant and the dielectric constant as a function of the amount of calcium in the sintered piezoelectric body of the prior art;

DETAILED DESCRIPTION OF THE INVENTION

While improved results are achieved with the piezoelectric bodies of the invention having calcium content of 30-40 at.%, it has been found that even more improved results are achieved when the content of calcium is within 34-36 at.% inclusive.

According to the novel method of the invention, the piezoelectric bodies may be prepared while calcining the ground mixture of the oxides PbO, CaO, TiO, CoO, WO$_3$ and at least one of MnO, MnO$_2$, NiO and Nb$_2$O$_3$ or of the precursors of these oxides such as the hydroxides, carbonates or acetates, all in amounts adapted to form piezoelectric bodies of the composition of the invention and sintering the resultant calcined mixture in an atmosphere consisting essentially of 10-20% of oxygen and 90-80% of nitrogen at a temperature of 1000° C.-1200° C. at a period of 1-50 hours.

Calcining is carried out preferably at a temperature of 925° C.-975° C. It has been found that the best results are achieved when the sintering is carried out in air at a temperature of 1100° C.-1150° C. for a period of 5 hours to 30 hours.

For a more complete understanding of the invention, operation of preferred embodiments of the invention will now be described in greater detail with reference to the following example.

EXAMPLE

Compositions of several variations of x and y in the formula

$$Pb_{1-x}Ca_xTi_{1-y}(Co_{\frac{1}{3}}W_{\frac{2}{3}})_yO_3 + 0.01MnO$$

were prepared from the raw materials: PbO, CaO or CaCO$_3$, TiO$_2$, Co(OH)$_2$, WO$_3$ and MnO in the amounts as shown in the following Table 1.

TABLE 1

| | Material weight for $Pb_{1-x}Ca_xTi_{1-y}(Co_{\frac{1}{3}}W_{\frac{2}{3}})_yO_3 + 0.01$ MnO system | | | |
|---|---|---|---|---|
| Material Weight for 1 Mole (g) | X = 0.34 Y = 0.04 | X = 0.34 Y = 0.06 | X = 0.36 Y = 0.04 | X = 0.38 Y = 0.04 |
| Raw Materials | | | | |
| PbO (223.19) | 147.3054 | 147.3054 | 142.8416 | 138.3778 |
| CaO (56.08) | 19.0672 | — | — | 21.3104 |
| CaCO$_3$ (100.0912) | — | 34.0310 | 36.0328 | — |
| TiO$_2$ (79.90) | 76.7040 | 75.1060 | 76.7040 | 76.7040 |
| Co(OH)$_2$ (92.933) | 1.8587 | 2.7880 | 1.8587 | 1.8587 |
| WO$_3$ (231.85) | 4.6370 | 6.9555 | 4.6370 | 4.6370 |
| MnO (70.938) | 0.7094 | 0.7094 | 0.7094 | 0.7094 |
| 2% extra PbO | 4.4638 | 4.4638 | 4.4638 | 4.4638 |
| Evaporation | | | | |
| CO$_2$ (44.0112) | — | −14.9638 | −15.8440 | — |
| H$_2$O (18.0000) | −0.3600 | −0.5400 | −0.3600 | −0.3600 |
| 2% extra PbO | −4.4638 | −4.4638 | −4.4638 | −4.4638 |
| Composition | 249.6016 | 251.3915 | 246.5795 | 242.9172 |

TABLE 1-continued

| Material weight for $Pb_{1-x}Ca_xTi_{1-y}(Co_{\frac{1}{2}}W_{\frac{1}{2}})_yO_3 + 0.01$ MnO system | | | | |
|---|---|---|---|---|
| Material Weight for 1 Mole (g) | X = 0.34 Y = 0.04 | X = 0.34 Y = 0.06 | X = 0.36 Y = 0.04 | X = 0.38 Y = 0.04 |
| Weight (g) | | | | |

After being weighed, the mixtures of these raw materials were prepared by mixing in a plaster bottle with zirconic balls and alcohol.

The resultant mixtures were then ball milled for 24 hours, dried at 120° C., crushed and calcined in an aluminum crucible at 950° C. for 2 hours.

The resultant calcined lumps were then crushed and ground in a mortar, sieved to pass 50 mesh, and ground again with a few weight % of deionized water. The wet calcined mixture was then pressed at $1\times10^8$ N/m² (1000 Kg/cm²) in a die of 1.905 cm in diameter into green discs.

The green discs were positioned between two platinum sheets to decrease Pb evaporation, and sintered in a covered crucible at 1100°–1120° C. for 1, 5 or 30 hours.

The sintered discs were lapped to a thickness of 0.9–1.3 mm. Both surfaces of the discs were then polished to a high brightness.

Gold electrodes were then provided on both surfaces of the discs by sputtering.

The gold-electroded discs were then poled in an oil bath at an elevated temperature in an electric field of 50 kV/cm for 5 minutes.

The dielectric constant K, the thickness coupling factor $k_t$, the planar coupling factor $k_p$, the dissipation factor D and the piezoelectric constant $d_{33}$ were then determined for the resultant sintered discs.

The dielectric constant K, the coupling factors $k_t$ and $k_p$, the piezoelectric constant $d_{33}$ and the dissipation factor D as a function of x amounts of Ca for bodies of the system $Pb_{1-x}Ca_xTi_{0.96}(Co_{\frac{1}{2}}W_{\frac{1}{2}})_{0.04}O_3+0.01$MnO are shown in the graph of FIG. 1.

These are also shown as a function of y amounts of $(Co_{\frac{1}{2}}W_{\frac{1}{2}})$ for the bodies of the system. $Pb_{0.66}Ca_{0.34}Ti_{1-y}(Co_{\frac{1}{2}}W_{\frac{1}{2}})_yO_3+0.01$MnO in the graph of FIG. 2.

The effect of sintering time on these for bodies of the system $Pb_{0.66}Ca_{0.34}Ti_{0.94}(Co_{\frac{1}{2}}W_{\frac{1}{2}})_{0.06}O_3+0.01$MnO are shown in the graph of FIG. 3.

Additionally the dielectric constant K, and the coupling factors $k_p$ and $k_t$ as a function of x amounts of Ca for bodies of the system $Pb_{1-x}Ca_xTi_{0.96}(Co_{\frac{1}{2}}W_{\frac{1}{2}})_{0.04}O_3+0.3$wt% MnO+0.4wt%NiO as described in Yamashita and Yokoyama et al, 1981 are shown in the graph of FIG. 4.

As will be noted from a comparison of the graphs of FIGS. 1, 2 and 3 with the graph of FIG. 4, the sintered lead calcium titanate piezoelectric bodies of the invention exhibit significantly higher $k_t/k_p$ ratios particularly when sintered from 5 to 30 hours.

The sintered lead calcium titanate piezoelectric bodies of the invention have the additional advantage of exhibiting a significantly higher piezoelectric constant.

What is claimed:

1. A method of producing a sintered piezoelectric body having a composition of the formula $Pb_{1-x}Ca_xTi_{1-y}(Co_{\frac{1}{2}}W_{\frac{1}{2}})_yO_3+0.005-0.02(A)$ wherein A is a member selected from the group consisting of MnO, $MnO_2$, NiO and $Nb_2O_3$ and mixtures thereof, wherein x=0.3–0.4 and $0.04<y\leq0.06$ said piezoelectric body having a high thickness coupling factor $k_t$, a low planar coupling factor $k_p$, a high dielectric constant K, a high piezoelectric constant $d_{33}$ and a low dissipation factor D, said method comprising:

(a) calcining a ground mixture of the oxides PbO, CaO, TiO, $Co(OH)_2$, $WO_3$ and at least one of MnO or $MnO_2$ or of the precursors of said oxides in amounts adapted to form said composition and sintering the resultant calcined mixture in an atmosphere consisting essentially of 10–20% of oxygen and 90–80% of nitrogen at a temperature of 1000° C.–1200° C. for a period of 5 hours–30 hours.

2. The method of claim 1 wherein the sintering is carried out in air at a temperature of 1100°–1150° C. for a period of 5 hours–30 hours.

3. The method of claim 2 wherein the calcination is carried out at a temperature of about 925° C.–975° C.

4. A sintered piezoelectric body produced by the method of claim 1.

5. A sintered piezoelectric body produced by the method of claim 2.

* * * * *